US006366193B2

(12) United States Patent
Duggal et al.

(10) Patent No.: US 6,366,193 B2
(45) Date of Patent: Apr. 2, 2002

(54) CURRENT LIMITING DEVICE AND MATERIALS FOR A CURRENT LIMITING DEVICE

(75) Inventors: Anil Raj Duggal, Niskayuna, NY (US); Siegfried Aftergut, New Haven, CT (US); Larry Neil Lewis, Scotia; David Alan Nye, Clifton Park, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/892,429

(22) Filed: Jun. 28, 2001

Related U.S. Application Data

(60) Division of application No. 09/525,810, filed on Mar. 15, 2000, now Pat. No. 6,290,879, which is a continuation-in-part of application No. 09/081,888, filed on May 20, 1998, now Pat. No. 6,124,780.

(51) Int. Cl.[7] .............................. H01B 1/20; H01L 7/10
(52) U.S. Cl. ..................... 338/22 R; 252/511; 252/512; 252/514
(58) Field of Search ................................ 338/22 R, 20, 338/21, 99; 252/511, 512, 514

(56) References Cited

U.S. PATENT DOCUMENTS

| | | | |
|---|---|---|---|
| 3,226,600 | A | 12/1965 | Zielasek |
| 3,243,753 | A | 3/1966 | Kohler |
| 3,673,121 | A | 6/1972 | Meyer |
| 4,017,715 | A | 4/1977 | Whitney et al. |
| 4,101,862 | A | 7/1978 | Takagi et al. |
| 4,237,441 | A | 12/1980 | Van Konynenburg et al. |
| 4,304,987 | A | 12/1981 | Van Konynenburg |
| 4,317,027 | A | 2/1982 | Middleman et al. |
| 4,583,146 | A | 4/1986 | Howell |
| 4,685,025 | A | 8/1987 | Carlomagno |
| 4,890,186 | A | 12/1989 | Matsubara et al. |
| 5,057,674 | A | 10/1991 | Smith-Johannsen |
| 5,068,634 | A | 11/1991 | Shrier |
| 5,166,658 | A | 11/1992 | Fang et al. |
| 5,247,276 | A | 9/1993 | Yamazaki |
| 5,260,848 | A | 11/1993 | Childers |
| 5,313,184 | A | 5/1994 | Greuter et al. |
| 5,382,384 | A | 1/1995 | Biagrie et al. |
| 5,382,938 | A | 1/1995 | Hansson et al. |
| 5,384,075 | A | 1/1995 | Okami |

(List continued on next page.)

FOREIGN PATENT DOCUMENTS

| | | |
|---|---|---|
| EP | 0640995 | 3/1995 |
| EP | 0713227 | 5/1996 |
| EP | 0747910 | 12/1996 |
| WO | 9112643 | 8/1991 |
| WO | 9321677 | 10/1993 |
| WO | 9410734 | 5/1994 |
| WO | 9534931 | 12/1995 |
| WO | 9119297 | 12/1997 |

*Primary Examiner*—Mark Kopec
(74) *Attorney, Agent, or Firm*—Toan P. Vo; Noreen C. Johnson

(57) ABSTRACT

A current limiting device comprises at least two electrodes; an electrically conductive composite material between the electrodes; interfaces between the electrodes the said composite material; and an inhomogeneous resistance distribution structure at the interfaces. During a high current event, adiabatic resistive heating at the interfaces causes rapid thermal expansion and vaporization and at least a partial physical separation at the interfaces; so the resistance of the current limiting device increases. The composite material comprises at least one polymeric matrix material and at least one electrically conductive material, and the polymeric matrix material comprises at least one epoxy and at least one silicone.

14 Claims, 4 Drawing Sheets

U.S. PATENT DOCUMENTS

| | | | | |
|---|---|---|---|---|
| 5,414,403 A | | 5/1995 | Greuter et al. | |
| 5,416,462 A | | 5/1995 | Demarmels et al. | |
| 5,432,140 A | | 7/1995 | Sumpter et al. | |
| 5,436,274 A | | 7/1995 | Sumpter et al. | |
| 5,449,714 A | | 9/1995 | Inoue et al. | |
| 5,451,919 A | | 9/1995 | Chu et al. | |
| 5,581,192 A | | 12/1996 | Shea et al. | |
| 5,602,520 A | | 2/1997 | Baiatu et al. | |
| 5,614,881 A | | 3/1997 | Duggal et al. | |
| 5,644,283 A | | 7/1997 | Grosse-Wilde et al. | |
| 5,659,004 A | * | 8/1997 | Takigawa et al. | 528/101 |

* cited by examiner

CURRENT LIMITING DEVICE AND MATERIALS FOR A CURRENT LIMITING DEVICE

This application is a division of U.S. patent application Ser. No. 09/525,810 filed on Mar. 15, 2000, now U.S. Pat. No. 6,290,879; which application is a continuation-in-part of U.S. patent application Ser. No. 09/081,888 filed on May 20, 1998, now U.S. Pat. No. 6,124,780.

This invention was developed under government support under Contact No. N00024-96-R4126 awarded by the Dept. of the Navy, and the government may have rights in this invention.

BACKGROUND OF THE INVENTION

This invention relates to materials for current limiting devices. In particular, the invention relates to polymeric materials for current limiting devices, and the devices themselves.

Current limiting devices are used in many electrical circuit applications to protect sensitive components from high fault currents. Applications range from low voltage and low current electrical circuits to high voltage and high current electrical distribution systems. An important requirement for many applications is a fast current limiting response time, alternatively known as switching time, to minimize the peak fault current that develops.

There are numerous devices that are capable of limiting the current in a circuit when a short circuit, otherwise known as a high current event, occurs. Known current limiting devices include a composite material that is a filled polymeric material that exhibits what is commonly referred to as a PTCR (positive-temperature coefficient of resistance) or PTC effect. Thus, the material can be referred to as a PTCR composite material. An attribute of PTCR composite material is that at a certain switch temperature the material undergoes a transformation from a basically conductive material to a generally resistive material.

In some current limiting devices, the PTCR composite material, typically polyethylene loaded with carbon black, is placed under pressure between electrodes. In operation, a current limiting device is placed in a circuit to be protected. Under normal circuit conditions, the current limiting device is in a low resistance and highly conductive state. When a high current condition occurs, the PTCR composite material heats up through resistive heating until a temperature above the "switch temperature" is reached. At this point, the PTCR composite material's resistance changes to a switched resistance, also known as a high resistance state, and the current is limited. When the high current condition is cleared, the current limiting device cools down over a time period, which may be long, to below the switch temperature. The current limiting device, which relies on the PTCR effect of the composite material, then returns to a highly conductive state. In the highly conductive state, the current limiting device is again capable of switching to the high resistance state in response to future high current events. It is desirable that the conductive material in a reusable current limiter device exhibit a low initial conductive condition resistance Ri and a high switched condition resistance, coupled with a large robustness that is characterized by a high number of successful repeated pulses, otherwise known as "successful shots".

Another current limiting device disclosed in U.S. Pat. No. 5,614,881, the entire contents of which are incorporated by reference, relies upon material ablation and arcing that occurs at localized switching regions in composite material. The ablation and arcing may lead to at least one of high mechanical and thermal stresses on the composite material. High mechanical and thermal stresses are of course undesirable, if not controlled.

The composite material, either a PTCR material or otherwise, after a switch cycle including ablation or arcing and returning to a normal circuit condition may further exhibit an altered resistance, such as a raised initial conductive condition resistance when compared to the initial conductive condition resistance before the high current event. This altered resistance is at least partially due to an incomplete ablation of the composite material at an interface that leaves non-conducting ablation products (ablation materials) at the interface that raise the resistance of the current limiting device. The switched conductive condition then possesses fewer electrical connections between the electrodes and the composite material due to the presence of the non-conducting ablation products at the interfaces, when compared to the initial conductive condition. The altered resistance is not desirable as the range of operation for the associated current limiting device will be changed.

Known composite materials may only exhibit satisfactory switching properties, such as a low initial conductive condition resistance and high switched resistance. The mechanical toughness of these materials is not as high as needed for some current limiting device applications, where brittleness of the composite material may limit repeated operations. Further, known composite materials for current limiting devices may exhibit satisfactory mechanical toughness and good switching properties for a first high current event. While generally acceptable for a first current limiting application, an initial conductive condition resistance $R_i$ of these composite materials will not be stable, and therefore undesirable for successive high current events.

Carbon black filled polyethylene material is used in a known current limiting device, a PTCR device available from ABB Control, Inc. (Prolim 36A Current Limiter). Tests of the carbon black filled polyethylene material were conducted to determine its ratio between $R_i$ and $R_{sw}$ and its robustness when used as the composite material in a current-limiting device, for example as set forth in U.S. Pat. No. 5,614,881 (using the Prolim 36A composite material instead of the composite material of U.S. Pat. No. 5,614,881). The tests were conducted by abrading the surfaces of a ¾"×¾" piece of the carbon black filled polyethylene material and placing the pieces between ¼" outer diameter electrodes under about 370 psi pressure. Pulses of about 400V, each for about 10 msec, with an amplifier capable of supplying 200 A of current were applied to the known carbon black filled polyethylene material.

The results of the test are illustrated in FIG. 1. The tests indicate that the carbon black filled polyethylene material exhibited an initial conductive condition resistance, $R_i$ equal to about 0.15 ohm, a switched condition resistance Rsw equal to about 16 ohm, and a resistance ratio $R_i/R_{sw}$ equal to about 107. The current limiter device with the polyethylene filled with carbon black material exhibited only 2 repeated pulses. These results do not lend to a successful reusable current limiter device.

Therefore, a need exists for composite materials for use in current limiting devices that are able to maintain a conductive surface at the interface, even after a high current event, without the build up of non-conducting ablation products as in prior devices, thus maintaining an initial conductive condition resistance that is generally the same as prior to the high current event. Additionally, a need exists for composite materials that possess desirable reproducible electrical and mechanical properties including a low initial conductive condition resistance, a high switched resistance, a large resistance ratio, substantially reproducible initial and switched resistances, mechanical toughness and durability, large robustness and an ability to provide a large number of repeated operations, and resistance to mechanical and thermal stresses.

SUMMARY OF THE INVENTION

The invention sets forth a current limiting device. The current limiting device comprises at least two electrodes; an electrically conductive composite material disposed between the at least two electrodes; a first interface between the composite material and a first electrode, and a second interface between the composite material and a second electrode; and an inhomogeneous distribution resistance structure at the interfaces. During a high current event, adiabatic resistive heating of the composite material at the interfaces causes rapid thermal expansion and vaporization of the composite material and separation of the electrodes from composite material and separations within the composite material proximate the interface so the resistance of the current limiting device increases. The electrically conductive composite material comprises a thermosetting material and at least one polymeric matrix material and at least one electrically conductive material. The at least one polymeric matrix material comprises at least one epoxy and at least one silicone and amine containing material, in which the at least one epoxy and the at least one silicone and amine containing material combine and react to form a thermosetting, electrically conductive composite material. A current limiting device, as in an exemplary embodiment of the invention, comprises at least two electrodes; an electrically conductive composite material between the electrodes; interfaces between the electrodes and the said composite material; and an inhomogeneous resistance distribution at the interfaces. During a high current event, adiabatic resistive heating at the interfaces causes rapid thermal expansion and vaporization and at least a partial physical separation at the interfaces and of the composite material proximate the interface so the resistance of the current limiting device increases. The composite material comprises at least one polymeric matrix material and at least one electrically conductive material, where the polymeric matrix material comprises at least one epoxy and at least one silicone.

A further aspect of the invention sets forth an electrically conductive composite composition for conducting electricity in an electrical current limiting device. The composition comprises at least one polymeric matrix material and at least one electrically conductive material. The at least one polymeric matrix material comprises at least one epoxy and at least one silicone and amine containing material, wherein the composition is capable of carrying current in an electrical current limiting device.

These and other aspects, advantages and salient features of the invention will become apparent from the following detailed description, which, when taken in conjunction with the annexed drawings, disclose embodiments of the invention.

BRIEF DESCRIPTION OF THE DRAWINGS

While the features of this invention are set forth in the following description, the invention will now be described from the following description of the invention taken in conjunction with the drawings, where like parts are designated by like reference characters throughout the drawings, and in which.

DETAILED DESCRIPTION OF THE INVENTION

Figure 1:
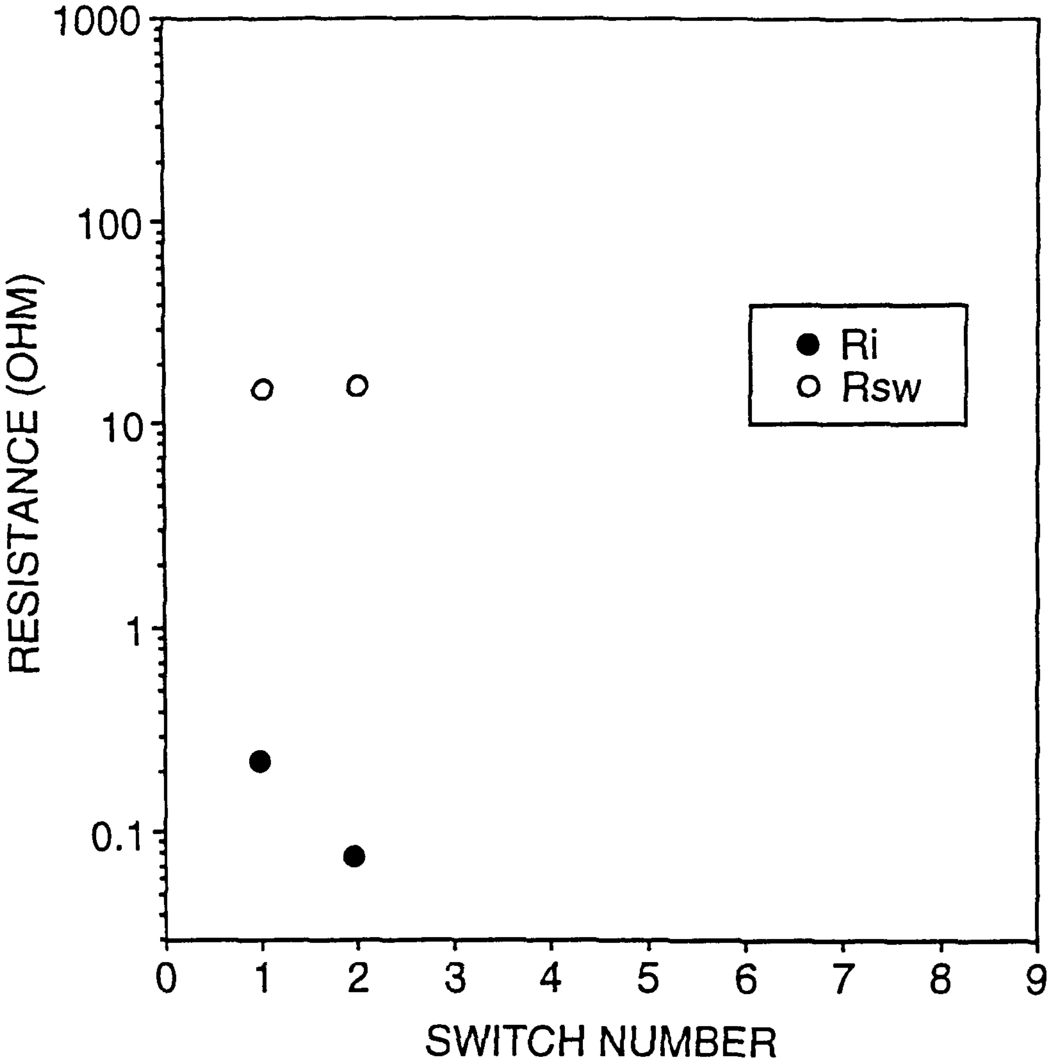
FIG. 1 illustrated an initial conductive condition resistance R; and switched resistance $R_s$W for successive voltage pulses for a known composite material.
Figure 2:
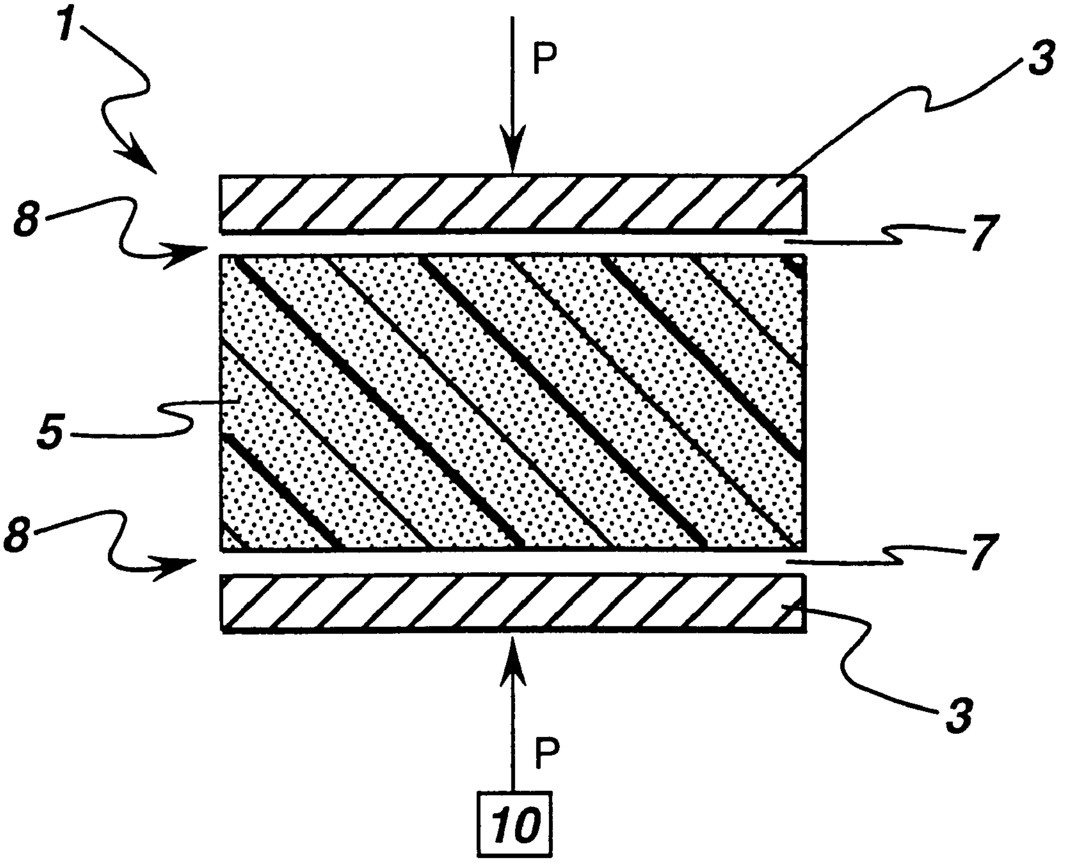
FIG. 2 is an exploded cross-sectional illustration of a current limiting device.
Figure 3:
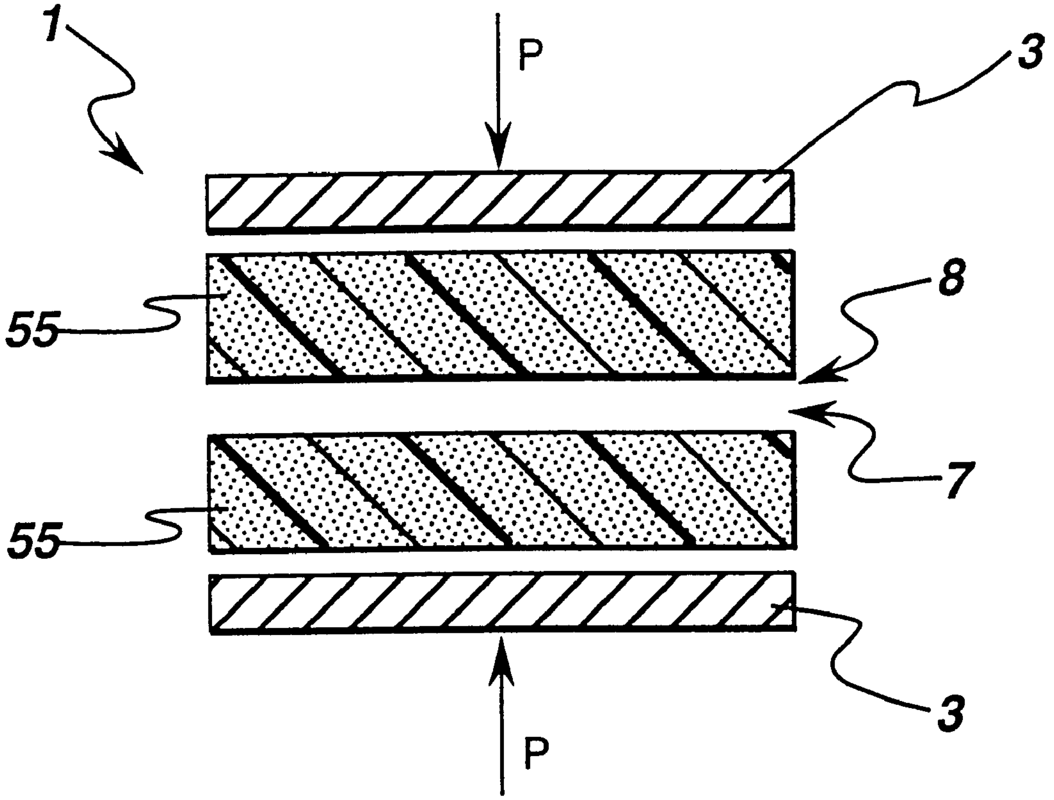
FIG. 3 is an exploded cross-sectional illustration of a second current limiting device.

The invention, as illustrated in FIGS. 2 and 3, comprises a high current multiple use fast-acting current limiting device 1 (hereinafter referred to as a current limiting device). The current limiting device 1 comprises first and second electrodes 3 and an electrically conductive composite material 5, such as a polymeric composite material (hereinafter referred to as a composite material) filled with a conductor, such as metals, alloys, and semiconductors, with inhomogeneous resistance distribution structure 7 under a compressive pressure P. The scope of the invention includes a current limiting device with any construction where a inhomogeneous resistance distribution structure 7 is between the electrodes 3. For example, the inhomogeneous resistance distribution structure 7 may be between two composite materials 55 in the current limiting device illustrated in FIG. 3. However, this is merely exemplary and is not meant to limit the invention.

The inhomogeneous resistance distribution structure 7 is typically chosen so that at least one thin layer of the composite material has a significantly higher electrical resistance than the remainder of the material. The inhomogeneous resistance distribution structure 7 is preferably positioned proximate (near, adjacent or in contact with) to at least one electrode 3 and composite material interface 8, and has a significantly higher resistance than an average resistance for a layer of the same size and orientation. The term significantly higher means that the resistance is higher in degrees noticeable during current flow so as to influence current flow, as discussed in further detail hereinafter.

The thin layer comprises a thickness that is in a range of 10 μm to about 200 μm regardless of the total thickness of the composite and exhibits a resistance that is at least about 10% greater than a resistance for a layer of the same size and orientation. The higher resistance thin layer can be created by providing a lower number of conductive filler particles that carry electrical current, in the thin layer than in another thin layer of the same size and orientation. This layer can be positioned at the interface, for example but not meant to limit the invention, by roughening the at least one of composite material and electrode surfaces, so only a subset of the conducting filler particles that would normally carry current with complete electrode and composite material contact are utilized. Alternatively, an incomplete thin, for example less than about 1 μm, layer of non-conducting material could be placed between the electrode and composite material. A thin higher resistance layer could also be placed in any region within the composite material by reducing the concentration of conducting filler particles within that region.

The current limiting device 1 is under compressive pressure P in a direction perpendicular to the thin high resistance layer. The compressive pressure P may be inherent in the construction of the current limiting device 1. Alternatively, the compressive pressure P may be exerted by a resilient structure, assembly or device 10, such as, but not limited to, a spring.

Composite materials that exhibit acceptable mechanical stability above about 100° C. and adequate mechanical toughness for at least a first switching are disclosed. For example, a conductor filled epoxy material is disclosed in U.S. patent application Ser. No. 08/896,874, filed Jul. 21, 1997, and a conductor filled silicone material is disclosed in U.S. Pat. No. 5,614,881, assigned to the Assignee of the instant application and of which the entire contents of each are fully incorporated herein.

In operation, the current limiting device 1, as embodied by the invention, is placed in the electrical circuit to be protected. During normal operation, the initial conductive condition resistance $R_i$ of the current limiting device is low. For example, the resistance of a current limiting device 1 is generally equal to the resistance of the composite material 5 plus the resistance of the electrodes 3. When a high current event occurs, a high density current flows through the current limiting device 1. In initial stages of a high current event, resistive heating of the current limiting device is believed to be adiabatic (without loss or gain of heat), and the high resistive layer heats up much faster than the remainder of the current limiting device 1. The adiabatic resistive heating is followed by rapid thermal expansion and gas evolution, both from the composite material 5 being ablated.

The thermal expansion and gas evolution lead to a partial, and sometimes a complete, physical separation (separation) of the electrodes 3 from the composite material 5 at an interface region (interface) 8. Additionally, parts of the composite material at, and in, the thin layer ablate and produce gas products. The ablation created gas products causes separations within the thin layer. The net result from these separations is reduced electrical connectivity between the electrode and the remainder of the composite material. The separations produce gaps at the interface 8 and a higher over all switched resistance to electric current flow. Therefore, the current limiting device 1 limits the flow of current in the circuit.

When conditions are present for the high current event to be cleared or otherwise interrupted, for example by any appropriate external clearing means (manual or automatic), the current limiting device 1 is returned to its initial structural configuration. A low resistance state should be regained due to the compressive pressure P (inherent in the device or by an outside means), which acts to push the separated layers together, allowing electrical current to be able to flow. The current limiting device 1 is reusable for many such high current event conditions.

The resistance after a first switching in prior known current limiting devices may not be as low as prior to the high current event, since ablation causes a build-up of non-conducting ablation products at the interfaces. Further, the composite materials in prior devices may not possess sufficient toughness to maintain its structural integrity and withstand repeated high current events at high temperatures associated with arcing and resistive heating.

The composite material, as embodied by the invention, typically ablates without causing or building up non-conducting ablation products at the interface. The composite material permits the current limiting device to return to its approximate initial conductive condition resistance $R_i$. Further, the composite material retains its mechanical and structural stability at elevated temperatures, for example at temperatures in a range between about 100° C. to about 200° C., and has a toughness that withstands large mechanical forces generated during repeated high current events.

The composite material, as embodied by the invention, comprises a polymeric matrix material that comprises at least one epoxy, at least one silicone, and at least one conductive material. The polymeric matrix material comprises a polymeric matrix material that is derived from epoxy and silicone precursors, where at least one of the epoxy and silicone precursor is filled with a conductive material, such as an electrically conductive filler, for example a metal, alloy or semiconductor. Alternatively, the conductive material is added as a separate component to the polymeric matrix material to form the composite material. This composite material provides an initial conductive condition resistance $R_i$ that is low, and a switched resistance $R_{sw}$, that is high. The composite material exhibits generally stable initial conductive condition resistances $R_i$ after repeated high current events, so the composite material ablates cleanly resulting in no or a reduced build-up of non-conducting ablation products between the electrode and the material compared to prior current limiter devices. This resultant surface permits the electrodes and composite material to generally retain its initial surface configuration, and thus generally retains its initial conductive condition resistance $R_i$.

The composite material comprises at least one epoxy, at least one silicone, and at least one conductive material and exhibits thermal and structural stability at temperatures greater than about 100° C. The material is stable at increased temperatures so as not to adversely effect structural properties at high temperatures. and not to adversely effect temperature dependent features. Accordingly, the composite material is mechanically tough and structurally stable to withstand more repeated high current events, than prior current limiter devices. The composite material's mechanical toughness is believed to be due, at least in part, to the incorporation of silicone into the polymeric matrix material, which provides bonds that are able to withstand large forces.

The epoxy for the composite material is selected from the group comprising condensation products of epichlorohydrin and bisphenol-A (Epon 828 Shell), an epoxy-functionalized silicone monomer, for example DMSE01 (Gelest Inc.), Araldite DT025 (CIBA), butyl glycidyl ether (epoxy), and other appropriate epoxy materials. The epoxy component of the polymeric matrix material is in a range between about 10% to about 90% by weight. The silicone for the composite material is selected from the group consisting of poly (methyl)(aminoethylaminopropyl)siloxane (PMAS), and Aminosilicine (Magnasoft ULTRA from WITCO Corp.), each of which comprises an amine and is provided in a range from about 10% to about 80% by weight of the polymeric matrix material. As is known in the art, amines and epoxies mix and react to form a thermosetting material.

The conductive material comprises a conductive filler material selected from the group comprising nickel powder, silver, carbon black and appropriate conductive materials. The conductive material comprises about 50% to about 90% by weight of the total composite material, with the polymeric matrix material comprising the remainder of the composite material. Alternatively, the conductive material can be expressed in terms of volume percentage, for example comprising about 10% to about 50% by volume, which corresponds to about 50% to about 90% by weight for a metal filler (silver and nickel powder). The percentages are approximate weight percentages, unless otherwise specified. Further, weight percentage of the conductive material is for the entire composite material and the weight percentage of the polymeric matrix material components are for a subtotal for a polymeric matrix material that is mixed with the conductive material.

The resistance stability of the composite material 5 after repeated high current events is believed to be partially due to chemical bonds derived from epoxy groups. The nature of the bonds leads to an essentially complete ablation over a substantially uniform thickness layer at the interface 8. The composite material 5, when ablated, does not produce a build-up of non-conductive ablation products that will raise the overall resistance of the current limiting device. Thus, the after switching resistance is generally the same as the initial conductive condition resistance $R_i$.

Several exemplary composite materials have been prepared that exhibit the desirable aspects of the composite material, as embodied by the invention. In the following discussion, the percentages are approximate weight percentages, unless expressed differently. Further, in the examples and throughout this application, terms A are sued as understood by a person of ordinary skill in the art with their reasonably understood meanings. For example, the term "generally" means commonly, usually, and normally. Other such terms are used with a reasonable everyday meaning, unless expressly discussed. The following composite materials and methods of formulation are merely exemplary, and are not meant to limit the invention in any way.

Example I

A first composite material comprises a polymeric matrix material formed from at least one epoxy and at least one silicone, and at least one conductive material. The composite material of Example I comprises about 65% of a conductive material and 35% of an epoxy-functionalized silicone as the polymeric matrix material. The conductive material of Example I is derived by dispersing the conductive material into a silicone containing material, such as a epoxy-functionalized silicone monomer, followed by curing epoxy groups of the monomer with an appropriate catalyst. The conductive material (often referred to as a filler) comprises nickel powder (Nickel 255 A/C Fines from Novamet Corp.) and the epoxy-functionalized silicone monomer comprised a liquid epoxy-containing dimethylsiloxane (GE UV9430). The liquid was polymerized to a solid with an iodonium salt catalyst, for example bis(4-dodecylphenyl)iodonium hexafluoro antimonate (GE UV9380C).

In particular, Example I is formed from 35 g of GE Silicones UV9430 (epoxy on-chain, polydimethylsiloxane) that is hand-mixed with 1.1 g of GE Silicones UV9380C (iodonium cure catalyst) and 65 g of Nickel 255 A/C fines powder (available from Novamet Corp.) in a beaker. 78.6 g of the mixture is placed in a 3"×3" Teflon® mold with a 13 lb. static applied load. This mixture is placed in an oven at 170° C. for 2 hours. The material is then taken out of the mold, and followed by post curing for 2 hours at 200° C.

Current limiting devices were made with the above-described composite material by abrading surfaces of the composite material, and placing the composite material between the electrodes, under 60 psi pressure, to create a current limiting device with an inhomogeneous resistance distribution. A slightly higher resistance occurs at an interface between the electrode and composite material. The exemplary current limiting device comprises ¼ outer diameter electrodes and a ¾×¾ piece of composite material that is about ⅛ thick.

Figure 4:
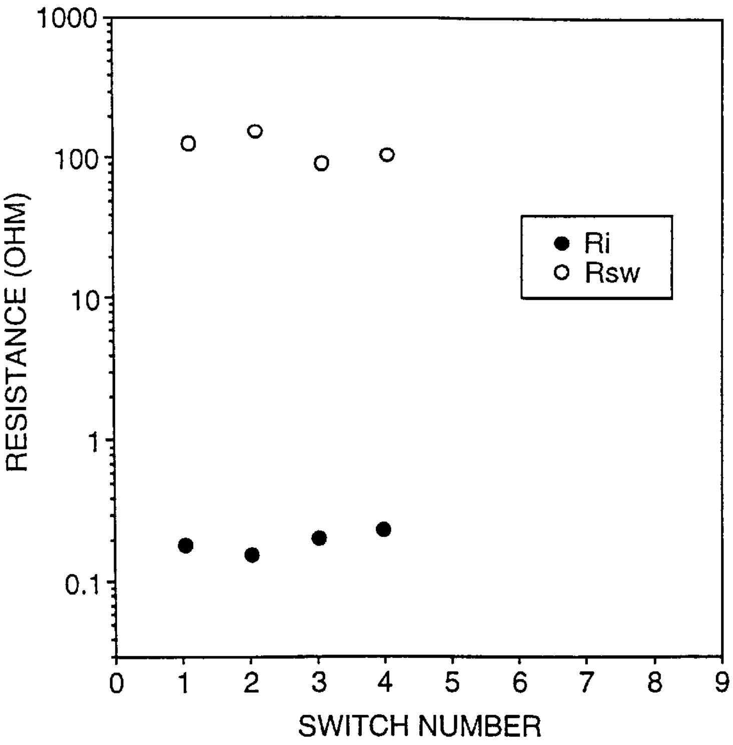
FIG. 4 illustrates an initial conductive condition resistance $R_i$ and switched resistance $R_{sw}$, for successive voltage pulses for a first composite material.

Current limiting properties of the above described current limiting device were tested by successively applying about 400V voltage pulses, each for 10 msec, with an amplifier capable of supplying 200A of current (test conditions are similar as discussed in the background). The current limiting device switched with the application of each voltage pulse. FIG. 4 illustrates an initial conductive condition resistance $R_i$ before each switching event and switched resistance $R_{sw}$, for successive and repeated voltage pulses. The switching properties indicate an initial conductive condition resistance $R_i$, a higher switched resistance $R_{sw}$, and generally stable values for successive pulses. Further, when the size of a current limiting device with the Example I composite material is increased in area by factor of about 60, and the same approximate current density and voltage are applied as above, the composite material possesses similar electrical and mechanical results without any substantial performance loss.

Example II

A second composite material, as embodied by the invention, is derived by dispersing a conductive filler in a polymeric matrix material, where the polymeric matrix material is formed from a high temperature capability epoxy resin that is cured with an appropriate material, such as an amino-containing silicone resin. The composite material comprises about 70% of a conductive material, for example a nickel material, as discussed above, and about 30% of a polymeric matrix material. The polymeric matrix material comprises about 100 parts of an epoxy resin, such as condensation products of epichlorohydrin and bisphenol-A (Epon 828), and about 82 parts of poly [(methyl)(aminoethylaminopropyl)siloxane (PMAS) as the silicone containing material.

In particular, Example II is formed from 16.5 g of Epon 828 (an aromatic epoxy available from Shell) and 13.5 g of 89124 (methylaminoethylaminopropyl-substituted polydimethyl siloxane) (available from GE Silicones) that are hand-mixed together. 70 g of Ni-255 A/C fine is then added, and the whole mixture is hand-blended using a mortar and pestle. This hand-blended mixture is then further mixed in a Semco tube mixing device for 10 minutes. The mixture is then poured into a 3"×3" aluminum mold and placed under 100 PSI pressure for 1 hour at 100° C. followed by post-curing for 2 hours at 150° C.

Figure 5:
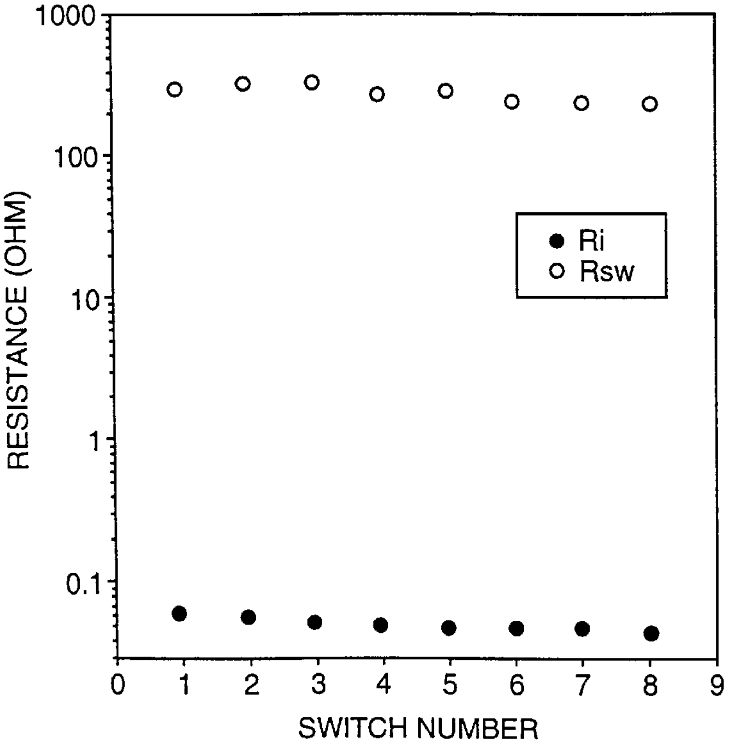
FIG. 5 illustrates an initial conductive condition resistance $R_i$ and switched resistance $R_{sw}$, during for successive voltage pulses for a second composite material.

FIG. 5 illustrates an initial conductive condition resistance $R_i$ before a switching event and a switched resistance $R_{sw}$, for successive voltage pulses in a current limiting device, applied in a similar manner as discussed above in Example I, however using the composite material of Example II. The switching properties illustrated in FIG. 4 illustrate a low initial conductive condition resistance $R_i$, a high switched resistance $R_{sw}$, and generally stable values for successive pulses. Also, similar to Example I, when the area of a current limiting device is increased by a factor of about 60, there is no discernible loss of performance.

In addition to Examples I and II, other formulations of composite materials comprising at least one epoxy (MC1), at least one silicone (MC2), and at least one conductive material were prepared. Table 1 lists the compositions for each material. The percentages listed in Table 1 are approximate weight percentages, unless otherwise specified. Again, the weight percentage of the conductive material is for the entire composite material and the weight percentage of the polymeric matrix material components, MC1–MC3, are for a subtotal for a polymeric matrix material that is mixed with the conductive material. Therefore, for Example A, the composite material comprised about 70% of a conductive material and about 30% of polymeric matrix material amount, where the polymeric matrix material comprises about 71% of an epoxy and 29% of PMAS. The switching properties of materials in Table I exhibit a low initial conductive condition resistance $R_i$, a high switched resistance $R_{sw}$, and generally stable values for successive pulses. Table 1 also lists average resistances for initial conductive conditions and switched conditions, as well as a resistance ratio. Also, the table lists the number of repeated pulses, also known as "successful shots" for the samples.

Examples A–D set forth composite materials that are substantially similar to Example II, however the ratio between the epoxy content (MC1) and the PMAS (MC2) is varied. These composite materials indicate that the ratio of epoxy and silicone can be varied and provide acceptable current limiting properties. Example E indicates that nickel concentrations other than about 70% (by weight) can be employed in a composite material, as embodied by the invention.

Examples F–J are similar to Example II, however, at least one additional component, such as one of: an epoxy, an epoxy reactant, and a polyglycol epoxy; a butyl glycydyl ether; and a further silicone containing material such as an aminofunctional silicone and epoxy-functionalized silicone, is included in the polymeric matrix material of the composite material. The additional material increases processability of the composite material, for example, by at least one of increasing a pot-life and decreasing viscosity of the polymeric matrix material during preparation, so conductive filler can be more easily incorporated into the composite material.

Examples K and L indicate that composite materials in accordance with one aspect of the invention, are derived by combining an epoxy-functionalized silicone, an aminosilicone and a conductive material. Further, Example K indicates that conductive materials other than nickel can be utilized in composite materials. Example M indicates that an epoxy, which is combined with an epoxy-functionalized silicone and an aminosilicone, can also be utilized to comprise a composite material's polymeric matrix, as embodied by the invention.

In still another example, Example N, a composite material comprises a polymeric material matrix that is fabricated from a mixture comprising approximately equal weights of two epoxy-functionalized siloxanes: 1,1,3,3-tetramethyl-1,3-bis((2-oxabicyclo (4.1.0) hept-3-yl)-ethyl) disiloxane and polydimethylsiloxane terminated with ethyl-2-(7-oxabicyclo (4.1.0) hept-3-yl) groups. One hundred parts of this mixture are catalyzed with about 3 parts of an iodonium salt catalyst, for example bis(4-dodecylphenyl)iodonium hexafluoro antimonate (GE UV9380C) to form the polymeric matrix material. About thirty-five parts of this polymeric matrix material is combined with about 65 parts of a conductive material, for example nickel powder.

The performance of the composite material of Example N indicates an initial conductive condition resistance $R_i$, a higher switched resistance $R_{sw}$, and generally stable values for successive pulses.

Therefore, as discussed above, the at least one epoxy of the at least one polymeric matrix material can comprise at least a first epoxy. The at least one silicone containing material can comprise at least a first silicone containing material. The composite material can further comprise at least one further material selected from a group consisting of at least a second epoxy, in which the second epoxy and the first epoxy are different; and at least a second silicone and amine containing material, wherein the second silicone and amine containing material and the first silicone and amine containing material are different. The term different is used as understood by a person of ordinary skill in the art in which the materials are not alike in their characteristics.

While various embodiments have been described herein, it will be appreciated from the specification that various combinations of elements, variations or improvements therein may be made by those skilled in the art, and are within the scope of the invention.

What is claimed is:

1. A current limiting device comprising:

at least two electrodes;

an electrically conductive composite material disposed between the at least two electrodes;

a first interface between the composite material and a first electrode, and a second interface between the composite material and a second electrode; and an inhomogeneous distribution resistance structure at the interfaces whereby, during a high current event, adiabatic resistive heating of the composite material at the interfaces causes rapid thermal expansion and vaporization of the composite material and separation of the electrodes from composite material and separations within the composite material proximate the interface so the resistance of the current limiting device increases;

wherein said electrically conductive composite material comprises a thermosetting material, and comprises:

at least one polymeric matrix material and at least one electrically conductive material, and the at least one polymeric matrix material comprises:

at least one epoxy; and at least one silicone, in which the at least one epoxy and the at least one silicone and amine containing material combine and react to form a thermosetting, electrically conductive composite material.

2. The device according to claim 1, where the at least one electrically conductive material comprises at least one conductive material selected from the group consisting of:

nickel powder, carbon black and silver powder.

3. The device according to claim 1, the at least one conductive material comprises about 50% to about 90% by weight of the conductive composite material.

4. The device according to claim 1, wherein the at least one polymeric matrix material comprises poly (methyl) (aminoethylaminopropyl)siloxane (PMAS).

5. The device according to claim 1, wherein the at least one polymeric matrix material comprises epoxy in a weight percent range between about 10% and about 90%, and the at least one silicone containing material in a weight percent range between about 10% and about 80%.

6. The device according to claim 1, wherein the at least one epoxy comprises a material selected from the group consisting of:

condensation products of epichlorohydrin and bisphenol-A; and epoxy-functionalized silicone.

7. The device according to claim 1, the at least one conductive material comprises about 10% to about 40% by volume of the conductive composite material.

8. The device according to claim 1, the at least one epoxy of the at least one polymeric matrix material comprising at least a first epoxy, the at least one silicone containing material comprising at least a first silicone containing material, the composite material further comprising at least one further material selected from a group consisting of:

at least a second epoxy, wherein the second epoxy and the first epoxy are different; and at least a second silicone and amine containing material wherein the second silicone and amine containing material and the first silicone and amine containing material are different.

9. The device according to claim 8, the second epoxy being selected from the group consisting of:

butyl glycydyl ether; polyglycol epoxy and epoxy-functionalized silicone.

10. The device according to claim 8, the at least a second silicone being selected from the group consisting of:

aminofunctional silicone and epoxy-functionalized silicone.

11. The device according to claim 8, the at least one conductive material comprises about 50% to about 90% by weight of the conductive composite material.

12. The device according to claim 8, the at least one conductive material comprises about 10% to about 40% by volume of the conductive composite material.

13. The device according to claim 8, wherein the at least one further material comprises between about 6% to about 35% by weight of the polymeric matrix material.

14. The device according to claim 1, further comprising means for exerting compressive pressure on the composite material, wherein the compressive pressure provided by the exerting means is applied in a direction generally parallel to a direction of current flow.

* * * * *